United States Patent
Chang et al.

(10) Patent No.: US 10,115,613 B2
(45) Date of Patent: Oct. 30, 2018

(54) METHOD OF FABRICATING A FAN-OUT PANEL LEVEL PACKAGE AND A CARRIER TAPE FILM THEREFOR

(71) Applicant: Samsung Electronics Co., Ltd., Suwon-si (KR)

(72) Inventors: Won-Gi Chang, Hwaseong-si (KR); Yeongseok Kim, Hwaseong-si (KR); Hyein Yoo, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/470,606

(22) Filed: Mar. 27, 2017

(65) Prior Publication Data
US 2017/0358467 A1    Dec. 14, 2017

(30) Foreign Application Priority Data
Jun. 13, 2016   (KR) .......................... 10-2016-0073310

(51) Int. Cl.
| | | |
|---|---|---|
| *H01L 21/00* | (2006.01) | |
| *H01L 21/67* | (2006.01) | |
| *H01L 21/673* | (2006.01) | |
| *H01L 21/56* | (2006.01) | |
| *H01L 23/00* | (2006.01) | |
| *H01L 23/31* | (2006.01) | |

(52) U.S. Cl.
CPC ...... *H01L 21/67121* (2013.01); *H01L 21/568* (2013.01); *H01L 21/673* (2013.01); *H01L 24/19* (2013.01); *H01L 23/3128* (2013.01); *H01L 2224/04105* (2013.01); *H01L 2224/12105* (2013.01); *H01L 2924/3511* (2013.01)

(58) Field of Classification Search
CPC ....... H01L 24/82; H01L 24/86; H01L 21/568; H01L 21/566; H01L 2224/04105
See application file for complete search history.

(56) References Cited

U.S. PATENT DOCUMENTS

| | | | | |
|---|---|---|---|---|
| 6,162,652 A | * | 12/2000 | Dass .................. | G01R 31/2884 257/E21.508 |
| 9,595,510 B1 | * | 3/2017 | Hung .................... | H01L 25/105 |
| 2005/0282374 A1 | * | 12/2005 | Hwang ............... | H01L 21/6835 438/613 |

(Continued)

FOREIGN PATENT DOCUMENTS

| | | |
|---|---|---|
| JP | 2013-001762 | 1/2013 |
| JP | 2015-021082 | 2/2015 |

(Continued)

*Primary Examiner* — Khiem D Nguyen
(74) *Attorney, Agent, or Firm* — Muir Patent Law, PLLC

(57) ABSTRACT

The present disclosure relates to a method of fabricating a semiconductor package. The method may include forming a cavity in a package substrate and providing the package substrate and a die on a carrier tape film. Here, the carrier tape film may include a tape substrate and an insulating layer on the tape substrate, and the die may be provided in the cavity of the package substrate. The method may further include subsequently forming an encapsulation layer to cover the insulating layer and the die in the cavity and cover the package substrate on the insulating layer and removing the tape substrate from the insulating layer.

19 Claims, 10 Drawing Sheets

(56) References Cited

U.S. PATENT DOCUMENTS

| | | |
|---|---|---|
| 2008/0115349 A1 | 5/2008 | Kim et al. |
| 2012/0237764 A1 | 9/2012 | Soejima et al. |
| 2013/0154091 A1* | 6/2013 | Wright .............. H01L 23/49816 257/738 |
| 2014/0017451 A1* | 1/2014 | Hwang .................. C09J 133/08 428/172 |
| 2015/0115464 A1* | 4/2015 | Yu ........................ H01L 21/486 257/774 |
| 2015/0262866 A1 | 9/2015 | Meyer et al. |

FOREIGN PATENT DOCUMENTS

| | | |
|---|---|---|
| JP | 2015-138940 | 7/2015 |
| KR | 10-0728748 | 6/2007 |
| KR | 10-2014-0050799 | 4/2014 |
| KR | 10-2014-0112679 | 9/2014 |
| KR | 10-2015-0057164 | 5/2015 |
| KR | 10-2015-0106332 | 9/2015 |
| KR | 10-2016-0017901 | 2/2016 |
| KR | 10-1595049 | 2/2016 |

* cited by examiner

METHOD OF FABRICATING A FAN-OUT PANEL LEVEL PACKAGE AND A CARRIER TAPE FILM THEREFOR

CROSS-REFERENCE TO RELATED APPLICATIONS

This U.S. non-provisional patent application claims priority under 35 U.S.C. § 119 to Korean Patent Application No. 10-2016-0073310, filed on Jun. 13, 2016, in the Korean Intellectual Property Office, the entire contents of which are hereby incorporated by reference.

BACKGROUND OF THE INVENTION

The present disclosure relates to a method of fabricating a package, and in particular, to a method of fabricating a fan-out panel level package and a carrier tape film therefor.

As an integration density of a semiconductor chip increases, its size is gradually decreased. However, a distance between bumps on a semiconductor chip is a fixed parameter that is given by international standards of the Joint Electron Device Engineering Council (JEDEC). Accordingly, it is difficult to change the number of bumps to be provided on a semiconductor chip. Also, as a semiconductor chip is shrunk, there is an increasing difficulty in handling and testing the semiconductor chip. In addition, there is another issue of how to diversify a board in accordance with a size of a semiconductor chip. To address these and other issues, a fan-out panel level package has been proposed.

SUMMARY

Some embodiments of the inventive concept provide a method of fabricating a package without damage of an encapsulation layer, and a carrier tape film to be used therefor.

According to some embodiments of the inventive concept, a method of fabricating a semiconductor package may include forming a cavity in a package substrate and providing the package substrate and a die on a carrier tape film. Here, the carrier tape film may include a tape substrate and an insulating layer on the tape substrate, and the die may be provided in the cavity of the package substrate. The method may further include subsequently forming an encapsulation layer to cover the insulating layer and the die in the cavity and cover the package substrate on the insulating layer and removing the tape substrate from the insulating layer.

According to some embodiments of the inventive concept, a method of fabricating a semiconductor package may include forming a cavity in a package substrate, pressing a carrier tape film on the package substrate, the carrier tape film including an insulating layer, an adhesive layer, and a tape substrate, aligning a semiconductor device in the cavity and pressing the die on the insulating layer, forming an encapsulation layer on the insulating layer, the semiconductor device, and the package substrate, irradiating a first light onto the adhesive layer to reduce an adhesive strength of the adhesive layer, removing the adhesive layer and the tape substrate from the insulating layer, and subsequently irradiating a second light, whose wavelength is different from that of the first light, onto a portion of the insulating layer to form contact holes on a portion of the package substrate and on a portion of the semiconductor device.

According to some embodiments of the inventive concept, a carrier tape film may include a tape substrate, an adhesive layer on the tape substrate, and an insulating layer on the adhesive layer. The adhesive layer may include monomers with adhesive functional groups and a first light initiator mixed with the monomers. The adhesive functional group may be removed by the first light initiator irradiated by a first light incident from an outside.

According to some embodiments of the inventive concept, a carrier tape film may include a tape substrate, an adhesive layer on the tape substrate, and an insulating layer on the adhesive layer. The adhesive layer may include an adhesive and beads mixed in the adhesive. When the adhesive layer is heated, the beads may be expanded to separate the adhesive from the insulating layer.

According to another embodiment, a method of forming a semiconductor package, includes: providing a package substrate including an opening therein; providing a carrier tape film including a tape substrate and an insulating layer stacked on each other and attached to each other by an adhesive layer formed therebetween; placing the package substrate on a first surface of the insulating layer; placing a semiconductor chip on the first surface of the insulating layer in the opening; subsequently forming an encapsulation layer to cover the insulating layer and the semiconductor chip in the cavity and to cover the package substrate on the insulating layer; and removing the tape substrate from the insulating layer by applying at least one of heat or light to the adhesive layer.

DETAILED DESCRIPTION

Figure 1:
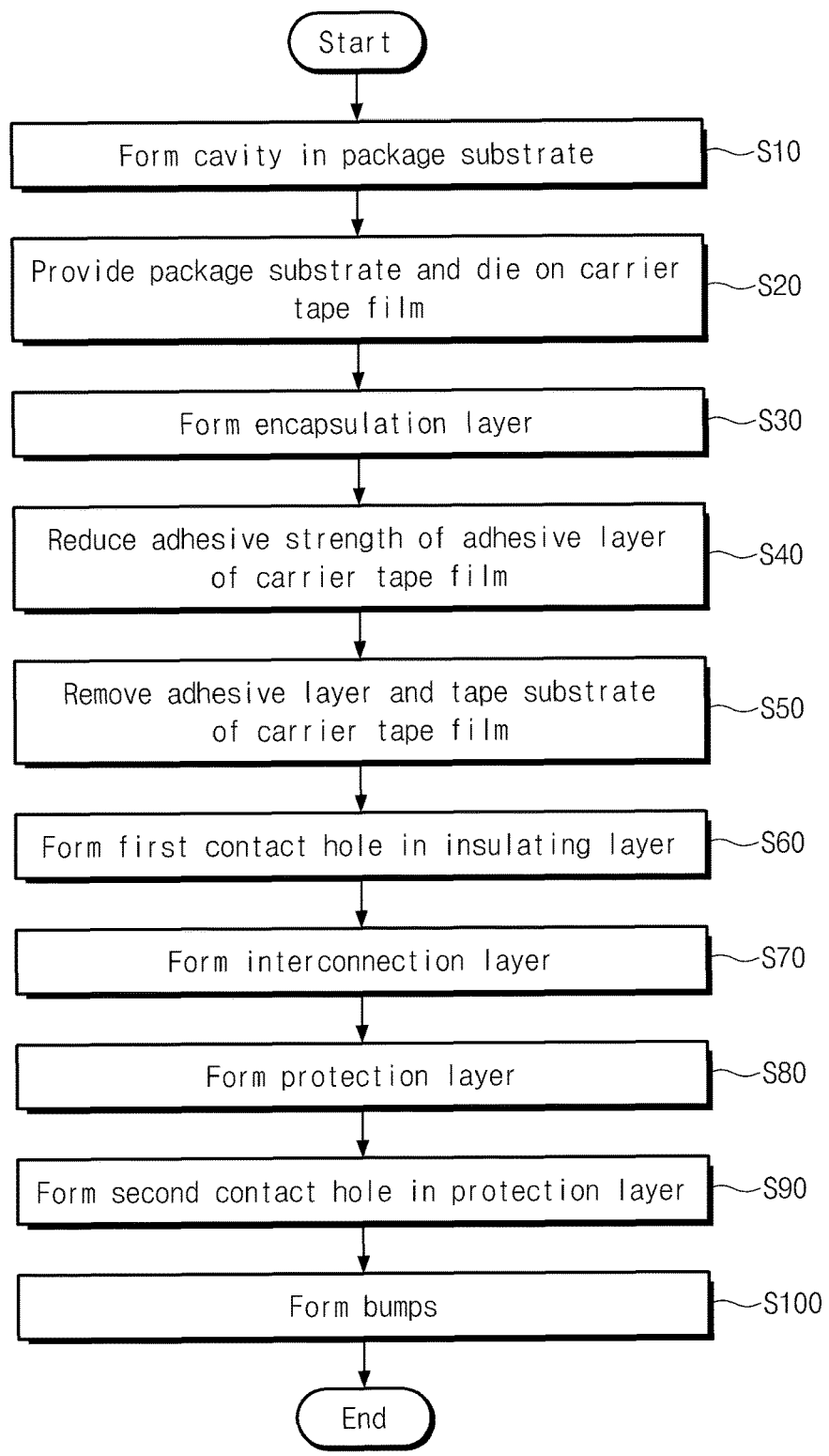
FIG. 1 is a flow chart illustrating a method of fabricating a package, according to some embodiments of the inventive concept.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other. As used herein, the singular forms "a", "an" and "the" are not intended to limit the described subject matter to only one item, unless the context clearly indicates otherwise.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

FIG. 1 is a flow chart illustrating a method of fabricating a package, according to some embodiments of the inventive concept.

Referring to FIG. 1, a method of fabricating a package may include a method of fabricating a fan-out panel level package. In some embodiments, the method of fabricating a package may include forming a cavity in a package substrate (in S10), providing a package substrate and a die on a carrier tape film (in S20), forming an encapsulation layer (in S30), reducing an adhesive strength of an adhesive layer of the carrier tape film (in S40), removing the adhesive layer and a tape substrate of the carrier tape film (in S50), forming a first contact hole in an insulating layer (in S60), forming an interconnection layer (in S70), forming a protection layer (in S80), forming a second contact hole in the protection layer (in S90), and forming bumps (in S100).

FIGS. 2 to 19 are sectional views illustrating a package fabricated by the method of FIG. 1, according to some embodiments.

Figure 2:
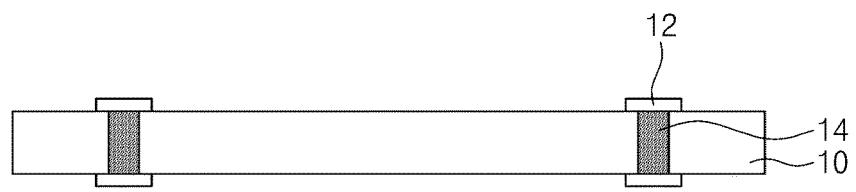
FIGS. 2 to 19 are sectional views illustrating an example package fabricated by the method of FIG. 1.

Referring to FIG. 2, a package substrate 10 may be a fan-out printed circuit board. For example, the package substrate 10 may include substrate pads 12 and substrate interconnection lines 14. The substrate pads 12 may be formed on top and bottom surfaces of the package substrate 10. The substrate pads 12 may be characterized in that they are formed at a surface of the substrate 10 and have a flat surface profile (e.g., a flat surface facing away from the substrate 10). The substrate pads 12 may also be characterized in that they have a longer horizontal dimension than vertical dimension. The substrate pads may connect to the substrate interconnection lines 14 at a terminal end of the substrate interconnection lines 14, and may have a greater horizontal width than a horizontal width of the interconnection lines 14 at an interface between the two. The substrate interconnection lines 14 may be formed in the package substrate 10. In some embodiments, the substrate interconnection lines 14 may include vertical lines. In exemplary embodiments, the substrate interconnection lines 14 may include horizontal lines (e.g., within the package substrate 10).

Figure 3:

Referring to FIGS. 1 and 3, a cavity 16 may be formed in the package substrate 10 (in S10). The cavity 16 may be formed between the substrate pads 12. The cavity 16 may be formed between the substrate interconnection lines 14. The cavity 16 may penetrate the package substrate 10 from a top surface to a bottom surface. For example, the cavity 16 may be a through hole penetrating the package substrate 10.

Figure 4:
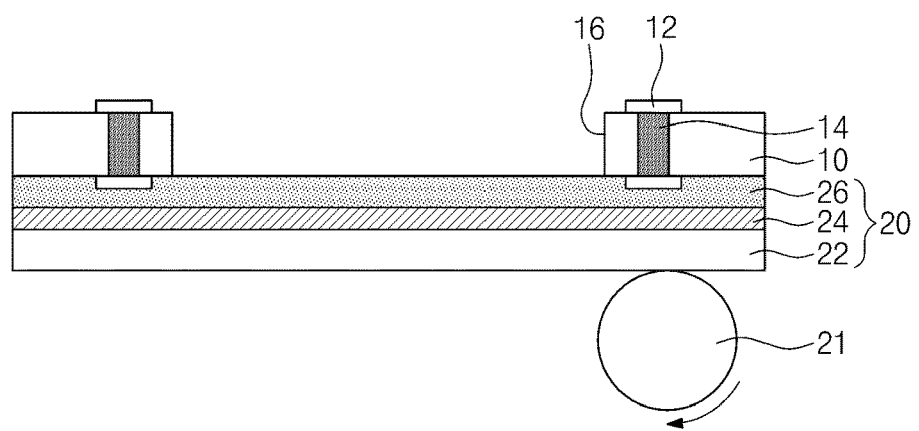
Figure 5:
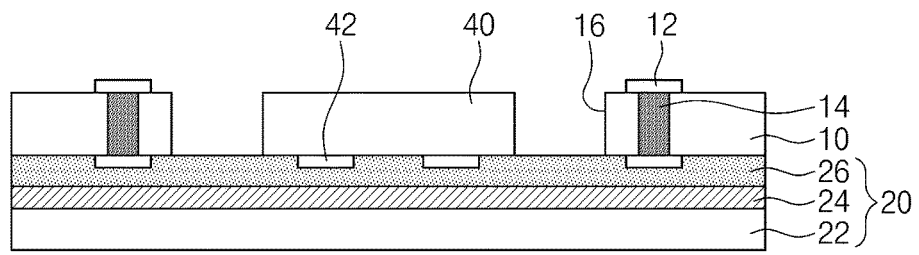

Referring to FIGS. 1, 4, and 5, the package substrate 10 and a die 40 may be provided on a carrier tape film 20 (in S20). In some embodiments, the package substrate 10 may be provided on the carrier tape film 20, and then, the die 40 may be provided on the carrier tape film 20 and in the cavity 16 of the package substrate 10. In this embodiment, both the package substrate 10 and the die 40 are provided on the same surface of the carrier tape film 20. For example, the layers of the carrier tape film 20 may be stacked in advance of the package substrate 10 and die 40 being provided on the carrier tape film 20.

Referring to FIG. 4, the carrier tape film 20 may include a tape substrate 22, an adhesive layer 24, and an insulating layer 26. The tape substrate 22 may be transparent. For example, the tape substrate 22 may be formed of or include a plastic film or a vinyl film. The adhesive layer 24 may be formed on the tape substrate 22. The adhesive layer 24 may be opaque. For example, the adhesive layer 24 may be formed of or include acrylic adhesives or acrylate adhesives. The insulating layer 26 may be formed on the adhesive layer 24. The adhesive layer 24 may be configured to bond the tape substrate 22 and the insulating layer 26 to each other with a specific adhesive strength. The tape substrate 22 may be thicker than the insulating layer 26. The tape substrate 22 may be affixed the insulating layer 26. In one embodiment, the tape substrate 22 and insulating layer 26 are formed in advance, and then are bonded together using the adhesive layer 24.

In exemplary embodiments, the carrier tape film 20 may be bonded to the package substrate 10 by heat. For example, a top surface of the insulating layer 26 may be melted, and the package substrate 10 may be provided on the melted top surface of the insulating layer 26. Thereafter, the insulating layer 26 may be hardened. As a result, the insulating layer 26 may be bonded to the package substrate 10.

The package substrate 10 may be provided on the carrier tape film 20. In some embodiments, the package substrate 10 may be pressed against the carrier tape film 20. For example, a roll 21 may be used to press the carrier tape film 20 against the package substrate 10. The package substrate 10 may be pressed on the top surface of the insulating layer 26. Accordingly, the insulating layer 26 and the package substrate 10 may be bonded to each other. Owing to the presence of the cavity 16, the package substrate 10 may be easily bent. The tape substrate 22 may make it possible to prevent warpage of the package substrate 10.

Referring to FIG. 5, the die 40 may have an area smaller than that of the cavity 16. The die 40 may include a semiconductor chip. Though a single die and/or chip is depicted, the die 40 can represent a stack of semiconductor chips including two or more semiconductor chips. The term "semiconductor device" may be used herein to generally refer to a semiconductor chip or stack of semiconductor chips. For example, the die 40 may include a memory device, components of a solid state drive, or an application processor. The die 40 may have device pads 42.

The die 40 may be aligned to the cavity 16 and then may be provided on the insulating layer 26. In some embodiments, the die 40 may be pressed against the carrier tape film 20. For example, a picker may be used to press the die 40 against the insulating layer 26 with a specific load. The device pads 42 may be provided in the insulating layer 26.

Figure 6:
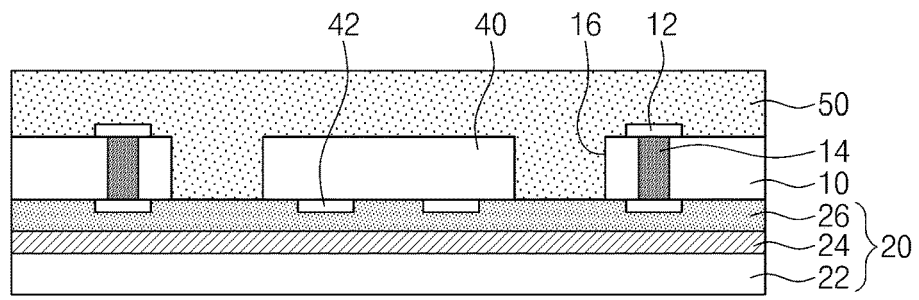

Referring to FIGS. 1 and 6, an encapsulation layer 50 may be formed on the package substrate 10 and the die 40 (in S30). For example, the encapsulation layer 50 may be dropped or coated on the package substrate 10 and the die 40. In some embodiments, the encapsulation layer 50 may be formed on the insulating layer 26 in the cavity 16 (e.g., and may contact a surface of the insulating layer 26 in the cavity 16). The encapsulation layer 50 may be provided between side surfaces of the die 40 in the cavity 16 and side surfaces of the package substrate 10. The encapsulation layer 50 may contact the side surfaces of the die 40 in the cavity 16 and the side surfaces of the package substrate 10 in the cavity 16. Thereafter, the encapsulation layer 50 may be hardened. The encapsulation layer 50 may be formed of or include, for example, at least one of epoxy polymer, acrylic polymer, or silicon polymer.

Figure 7:
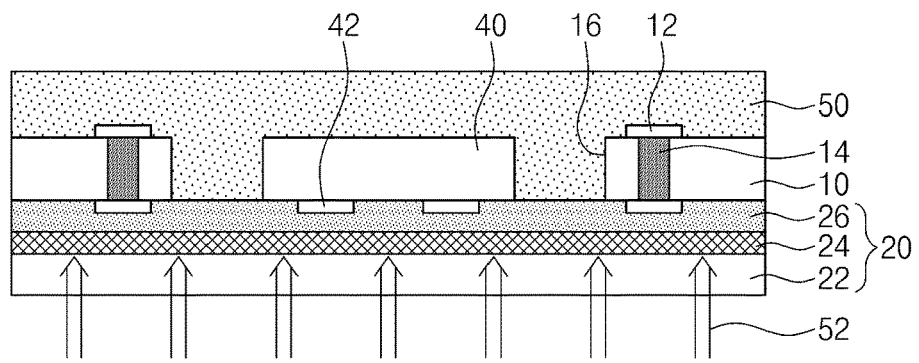

Referring to FIGS. 1 and 7, a first light 52 may be irradiated onto the adhesive layer 24 to reduce an adhesive strength of the adhesive layer 24 (in S40). The first light 52 may pass through the tape substrate 22. In some embodiments, a fraction or all of the first light 52 may be an ultraviolet light. For example, the first light 52 may have a wavelength of about 365 nm. Thus, in some embodiments, the first light 52 may be an ultraviolet light closer to the visible light spectrum. The first light 52 may be absorbed by the adhesive layer 24. The irradiation of the first light 52 may make it possible to vanish or reduce an adhesive strength of the adhesive layer 24. The insulating layer 26 may be insensitive to the first light 52.

Figure 20:
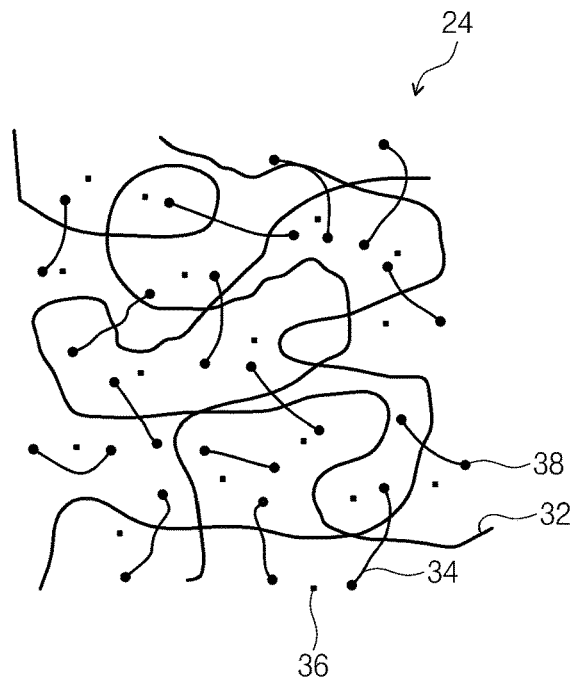
FIGS. 20 and 21 are diagrams exemplarily illustrating a step of reducing an adhesive strength of an adhesive layer of FIG. 7, according to some embodiments.
Figure 21:
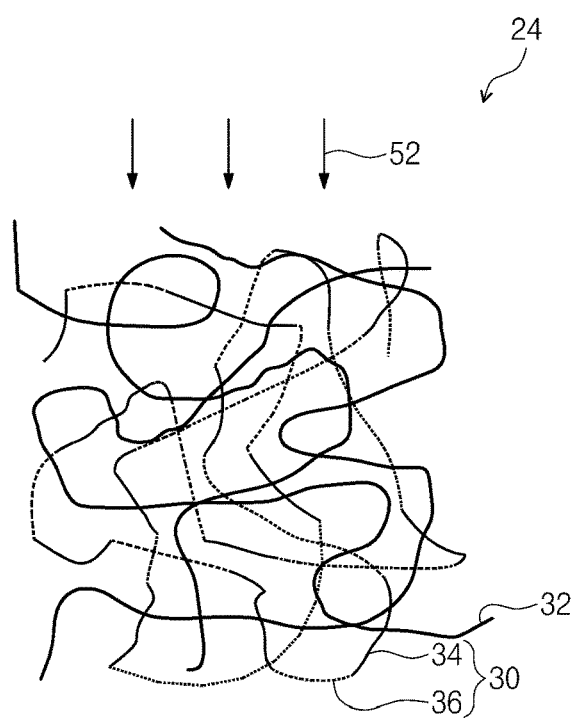

FIGS. 20 and 21 are diagrams exemplarily illustrating the step S40 of reducing an adhesive strength of the adhesive layer 24 of FIG. 7.

Referring to FIG. 20, the adhesive layer 24 may include first polymers 32, first monomers 34, and first light initiators 36. For example, the first polymers 32 may include acrylate polymers. The first polymers 32 may not have an adhesive property. The first monomers 34 may be mixed with the first polymers 32. The first monomers 34 may include acrylate monomers or acrylate oligomers. In some embodiments, each of the first monomers 34 may have adhesive functional groups 38. The adhesive functional groups 38 may have an adhesive property. For example, each of the adhesive functional groups 38 may include a vinyl group. The first light initiators 36 may be mixed with the first polymers 32 and the first monomers 34. The first light initiators 36 may include hydroxy dimethyl acetophenone (HP8), 2,4,6-trimethylbenzoyl-dipheny-phosphineoxide (TOP), or 2,3-diethylthioxanthone (DETX).

Referring to FIG. 21, as a result of the irradiation of the first light 52 and a chain reaction with the first light initiators 36, second polymers 30 may be formed from the first monomers 34. The first light 52 may activate the first light initiators 36, and this may lead to a polymerization reaction of the adhesive functional groups 38. In some embodiments, the first light initiators 36 may be reacted with the first light 52 to connect the adhesive functional groups 38 of the first monomers 34 to each other. The adhesive functional groups 38 may be connected to each other through the polymerization reaction. The adhesive functional groups 38 may be changed to functional groups (not shown) that do not exhibit an adhesive property any more. The adhesive functional groups 38 may be removed or decreased. Thus, the adhesive strength of the adhesive layer 24 may disappear or decrease.

In exemplary embodiments, the first light initiators 36 may be used to bridge between the adhesive functional groups 38 of the first monomers 34. As an example, the second polymers 30 may be a result of a polymerization reaction between the first light initiators 36 and the first monomers 34. The second polymers 30 may not have an adhesive property. Thus, the adhesive strength of the adhesive layer 24 may disappear or decrease.

Figure 8:
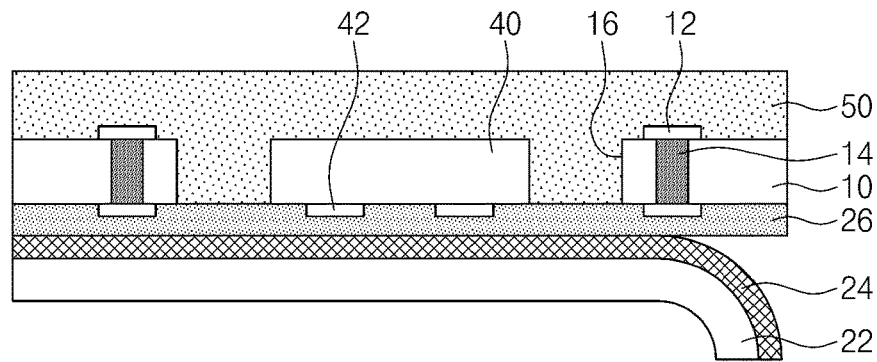

Referring to FIGS. 1 and 8, the adhesive layer 24 and the tape substrate 22 may be removed (in S50). The adhesive layer 24 may be separated from the insulating layer 26, regardless of the encapsulation layer 50. The insulating layer 26 may protect the encapsulation layer 50 during the process of removing the adhesive layer 24 and may remain after removing the adhesive layer 24 and tape substrate 22. For example, it may be possible to prevent the encapsulation layer 50 from being damaged. As an example, the adhesive layer 24 and the tape substrate 22 may be peeled from the insulating layer 26 by an external force. Although not shown, a cleaning process may be performed on the adhesive layer 24. Alternatively, the adhesive layer 24 may be developed by a first developing solution (not shown). The first developing solution may contain, for example, alkaline solution. In either case, the insulating layer 26 remains on the encapsulation layer 50 and so the removal of the adhesive layer 24 and tape substrate 22 does not affect the surface of the encapsulation layer 50 that contacts the carrier tape film 20 via the insulating layer 26.

Figure 9:
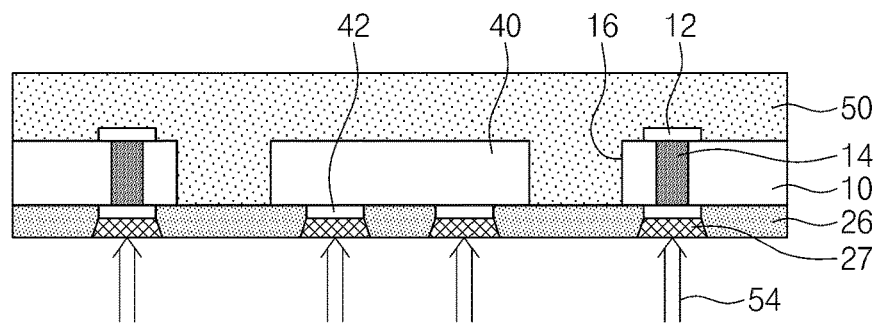
Figure 10:
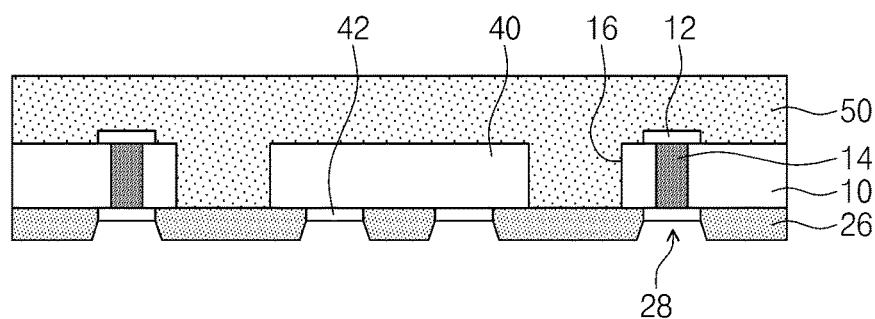

Referring to FIGS. 1, 9, and 10, a first contact hole 28 may be formed in the insulating layer 26 (in S60).

As shown in FIG. 9, a second light 54 may be irradiated onto the insulating layer 26. In some embodiments, a photolithography process may be performed to irradiate the second light 54 onto a portion of the insulating layer 26 (e.g., such as the portions shown in FIG. 9). The insulating layer 26 may be formed of or include a photo-imageable dielectric material. For example, the insulating layer 26 may be formed of or include a dielectric polyimide material with a photo-imageable property. The insulating layer 26 may be formed of a material with positive photosensitivity. As a result of the irradiation of the second light 54, the insulating layer 26 may include first portions 27 that are irradiated by the second light 54 and have different properties from the remaining portion of the insulating layer 26. For example, in the case where the remaining portion of the insulating layer 26 has hydrophobicity, the first portions 27 may have hydrophilicity.

In some embodiments, the second light 54 may be different from the first light 52. For example, the second light 54 may have a wavelength shorter than that of the first light 52. As an example, the second light 54 may have a wavelength of about 248 nm or about 193 nm. Alternatively, the second light 54 may have a wavelength longer than that of the first light 52. As an example, the second light 54 may have a wavelength of about 436 nm.

Although not shown, the insulating layer 26 may contain third polymers (not shown) and a second light initiator (not shown). The third polymers may have hydrophobicity. The third polymers may have binders. The third polymers may be a different material from the first polymers 32 and the second polymers 30. The third polymers may be formed of or include at least one of phenol polymers, polyphenylene benzobisoxazole (PBO) polymers, or polyimide polymers. Alternatively, the third polymers may be the same material as at least one of the first and second polymers. For example, the third polymers may include acrylate polymers.

The second light initiator may be mixed in the third polymers. For example, the second light initiators may include oxim ester photoinitiators or triazine-based photoinitiators.

If the second light initiator is exposed to the second light 54, the second light initiator may produce hydrogen cation ($H^+$) or an acidic material. The hydrogen cation or the acidic material may be used to cut the binders of the third polymers. Owing to the presence of the hydrogen cation or the acidic material, the third polymers may be changed to second monomers or second oligomers. The second monomers or the second oligomers may have hydrophilicity. For example, the second monomers may contain phenol monomers, polyphenylene benzobisoxazole monomers, polyimide monomer, or acrylate monomers. Accordingly, the insulating layer 26 may include the third polymers, and the first portion 27 may include the second monomers.

Referring to FIGS. 1 and 10, the first portions 27 of the insulating layer 26 may be removed to expose the substrate pads 12 and the device pads 42. In some embodiments, the insulating layer 26 may be developed by a second developing solution. The second developing solution may contain an alkaline solution. The second developing solution may be used to remove the first portions 27, and thus, the first contact hole 28 may be formed. For example, the second monomers or the second oligomers in the insulating layer 26 may be dissolved by the second developing solution. The substrate pads 12 and the device pads 42 may be exposed to the outside through the first contact hole 28 (e.g., to the outside of the package).

Referring to FIGS. 1 and 11 to 15, interconnection lines 70 may be formed on a portion of the insulating layer 26, the substrate pads 12, and the device pads 42 (in S70). The interconnection lines 70 may include redistribution lines. In some embodiments, the interconnection lines 70 may be formed using an electroplating process. The interconnection lines 70 may include, for example, a seed metal layer 62 and an interconnection metal layer 71. The interconnection metal layer 71 may be formed on the seed metal layer 62. In the process of forming the interconnection metal layer 71, the seed metal layer 62 may be used as a current-supplying layer.

Figure 11:
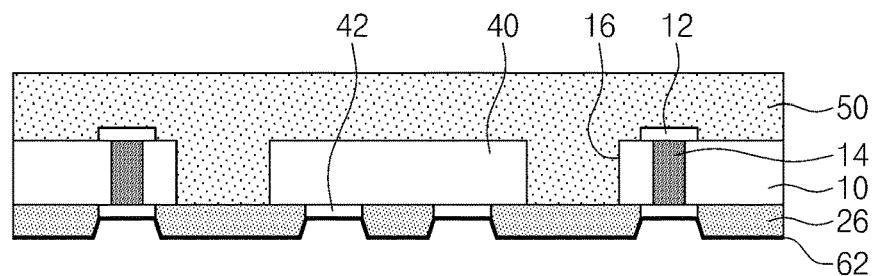

Referring to FIG. 11, the seed metal layer 62 may be formed on the substrate pad 12, the device pad 42, and the insulating layer 26. In some embodiments, the seed metal layer 62 may be formed by a sputtering process or a chemical vapor deposition process. For example, the seed metal layer 62 may be formed of or include at least one of tungsten, titanium, tantalum, or aluminum. The seed metal layer 62 may be formed to have a thickness from about 1 nm to about 100 nm.

Figure 12:
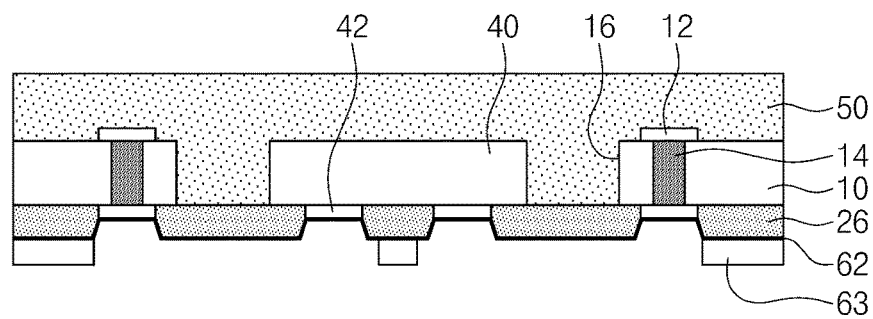

Referring to FIG. 12, a photoresist pattern 63 may be formed on a portion of the insulating layer 26. The photoresist pattern 63 may be formed by a photolithography process. Although not shown, the formation of the photoresist pattern 63 may include coating or dropping a photoresist material, exposing the photoresist material with a third light, and developing the photoresist material. A fraction or all of the third light may be an ultraviolet light. The third light may have the same wavelength as that of the second light 54. In exemplary embodiments, the wavelength of the third light may be different from that of the second light 54.

Figure 13:
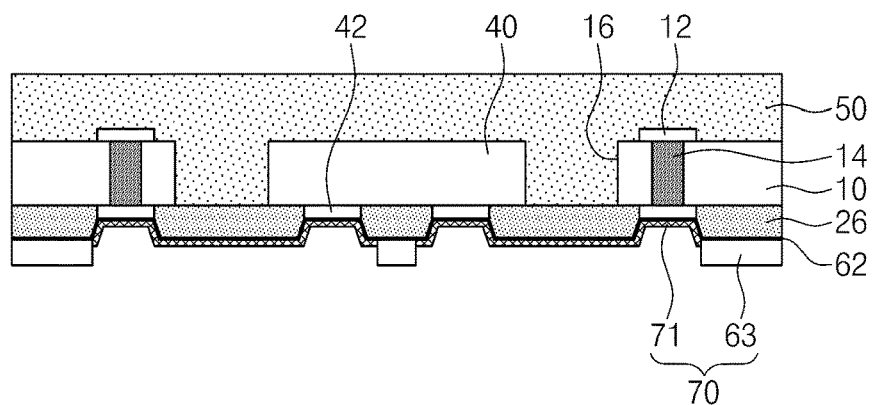

Referring to FIG. 13, the interconnection metal layer 71 may be formed on the seed metal layer 62 exposed by the photoresist pattern 63. In some embodiments, the interconnection metal layer 71 may be formed using an electroplating method. For example, the interconnection metal layer 71 may be formed of or include copper.

Figure 14:
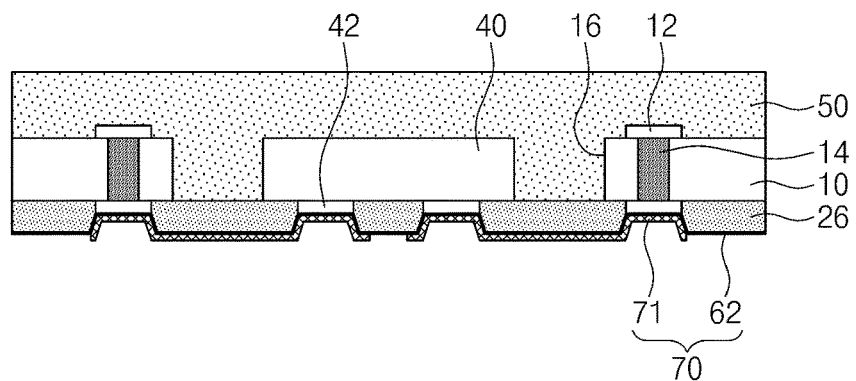

Referring to FIG. 14, the photoresist pattern 63 may be removed. The photoresist pattern 63 may be removed by, for example, an organic solvent. In the case where the interconnection metal layer 71 is formed by a sputtering process or a chemical vapor deposition process, the photoresist pattern 63 and the interconnection metal layer 71 thereon may be removed by a lift-off process.

Figure 15:
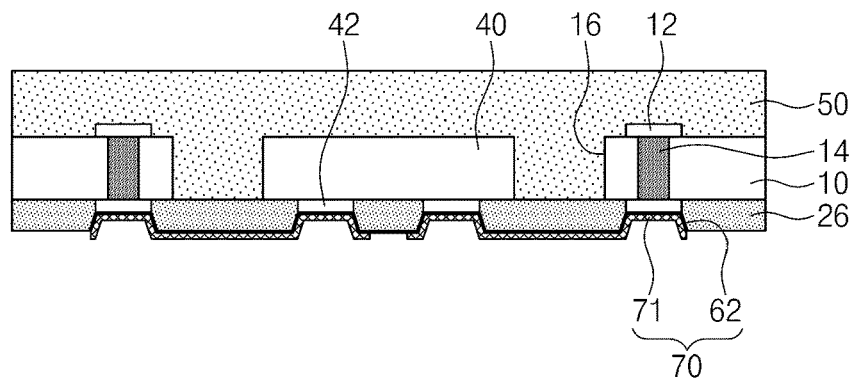

Referring to FIG. 15, the seed metal layer 62 may be removed from an outskirt region of the interconnection metal layer 71. As a result, the formation of the interconnection lines 70 may be finished (in S70). A portion of the seed metal layer 62 may be removed, for example, by a wet etching process. For example, the portion of the seed metal layer 62 may be isotropically etched by an acidic solution containing at least one of hydrochloric acid, sulfuric acid, nitric acid, or acetic acid. In exemplary embodiments, a portion of the seed metal layer 62 may be removed by a dry etching process. For example, the portion of the seed metal layer 62 may be anisotropically etched by an acidic or alkaline reaction gas. The interconnection lines 70 may be provided to connect the die 40 to the package substrate 10.

Figure 16:
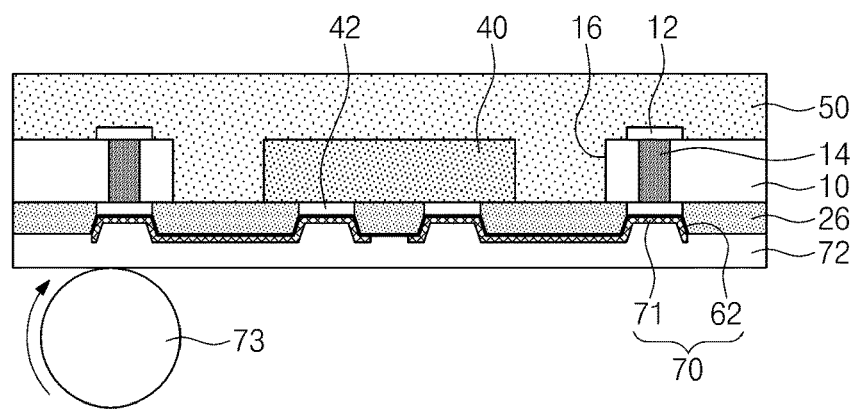

Referring to FIG. 16, a protection layer 72 may be formed on the interconnection lines 70 and the insulating layer 26 (in S80). In some embodiments, the protection layer 72 may be the same material as the insulating layer 26. The protection layer 72 may be formed of or include a dielectric polyimide material with a photo-imageable property. The protection layer 72 may be pressed on the interconnection lines 70 and the insulating layer 26 by a second roll 73.

Figure 17:
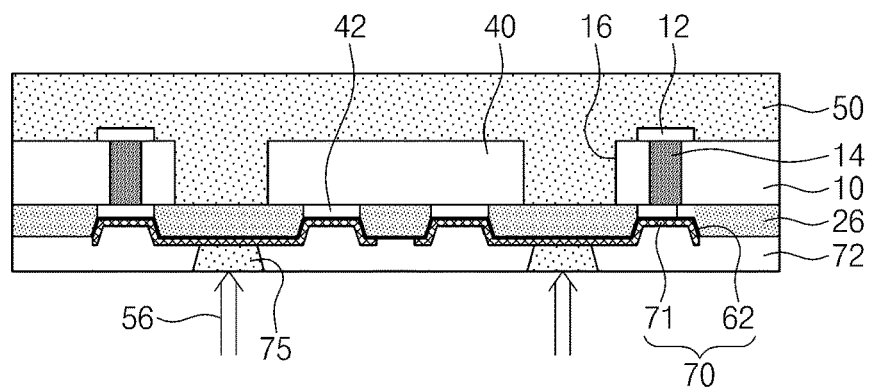
Figure 18:
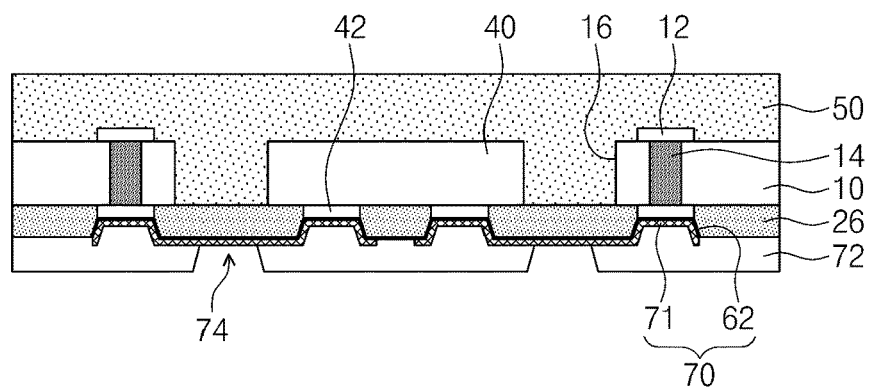

Referring to FIGS. 1, 17, and 18, second contact holes 74 may be formed (in S90). The second contact holes 74 may be formed to expose portions of the interconnection lines 70.

Referring to FIG. 17, a fourth light 56 may be irradiated onto portions of the protection layer 72 provided on the interconnection lines 70. The fourth light 56 may be the same as the second light 54. A fraction or all of the fourth light 56 may be an ultraviolet light, for example, whose wavelength is about 436 nm, about 248 nm, or about 193 nm. In some embodiments, the fourth light 56 may be provided through a photolithography process and may be used to form second portions 75 in the protection layer 72. The second portions 75 may be formed by the same process as that for the first portions 27.

Referring to FIG. 18, the second portions 75 of the protection layer 72 may be removed to partially expose the interconnection lines 70. The second portions 75 may have hydrophilicity. The second portions 75 may be removed by a fourth developing solution. The fourth developing solution may contain an alkaline solution.

Figure 19:
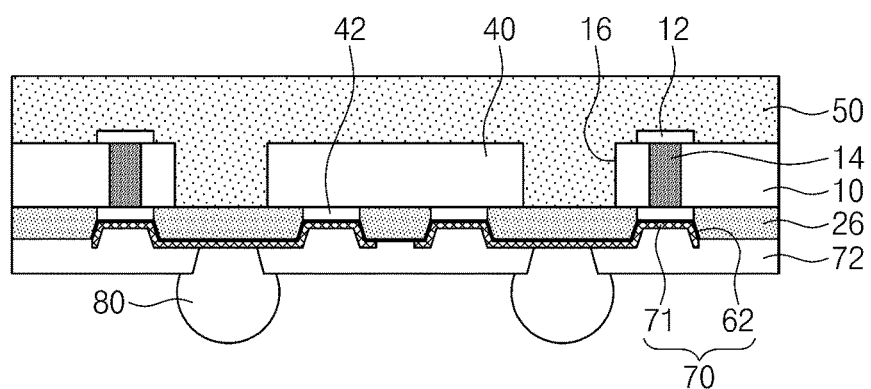

Referring to FIG. 19, bumps 80 may be formed in the second contact holes 74 and on the interconnection lines 70 (in S100). In some embodiments, the bumps 80 may be formed on the encapsulation layer 50 and at positions beyond the die 40. Alternatively, the bumps 80 may be formed on the die 40 or the package substrate 10. The number of the bumps 80 may increase in proportional to an area of the package substrate 10. The bumps may be formed of a conductive, metallic material. In one embodiment, they are solder bumps.

Figure 22:
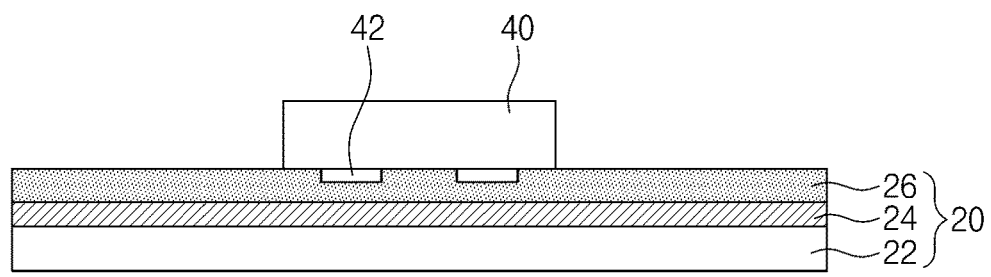
FIGS. 22 and 23 are sectional views exemplarily illustrating a step of providing a package substrate and a die, shown in FIG. 1, according to some embodiments.
Figure 23:
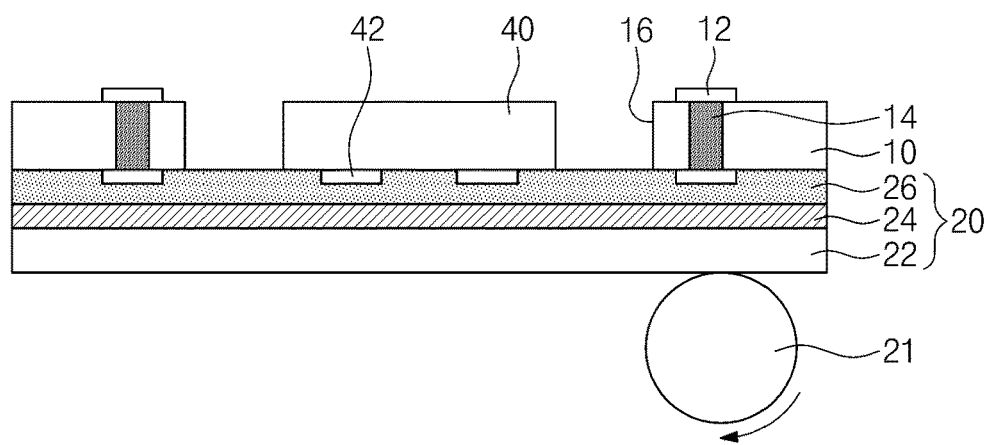

FIGS. 22 and 23 are sectional views exemplarily illustrating the step S20 of providing the package substrate 10 and the die 40, shown in FIG. 1.

Referring to FIGS. 1, 22, and 23, the die 40 and the package substrate 10 may be sequentially provided on the carrier tape film 20 (in S20). For example, the die 40 may be provided on the carrier tape film 20, and then, the package substrate 10 may be provided on the carrier tape film 20.

Referring to FIG. 22, the die 40 may be provided on the insulating layer 26 on the carrier tape film 20. For example, a picker may be used to press the die 40 on the insulating layer 26 of the carrier tape film 20 at a predetermined position.

Referring to FIG. 23, the package substrate 10 may be provided on the insulating layer 26. In some embodiments, the cavity 16 may be aligned with the die 40, and then, the package substrate 10 may be pressed on the carrier tape film 20. The insulating layer 26 and the package substrate 10 may be bonded to each other.

Figure 24:
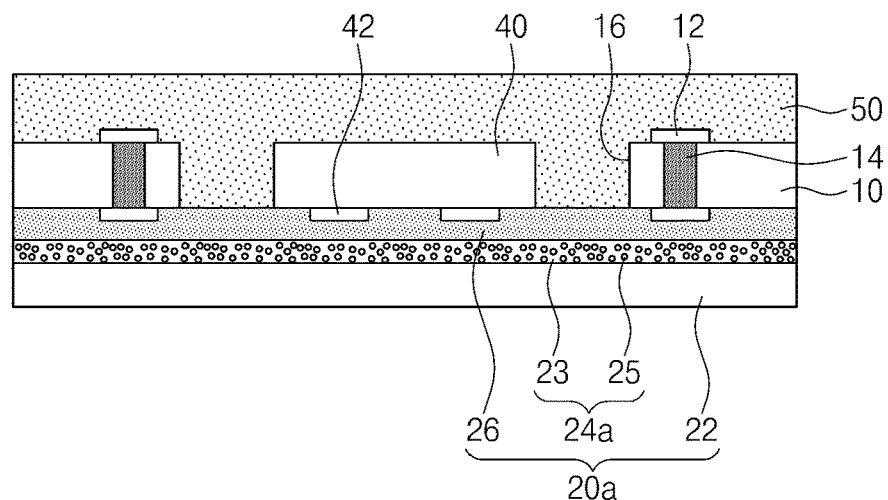
FIGS. 24 and 25 are sectional views exemplarily illustrating a step of reducing an adhesive strength, shown in FIG. 1, according to some embodiments.
Figure 25:
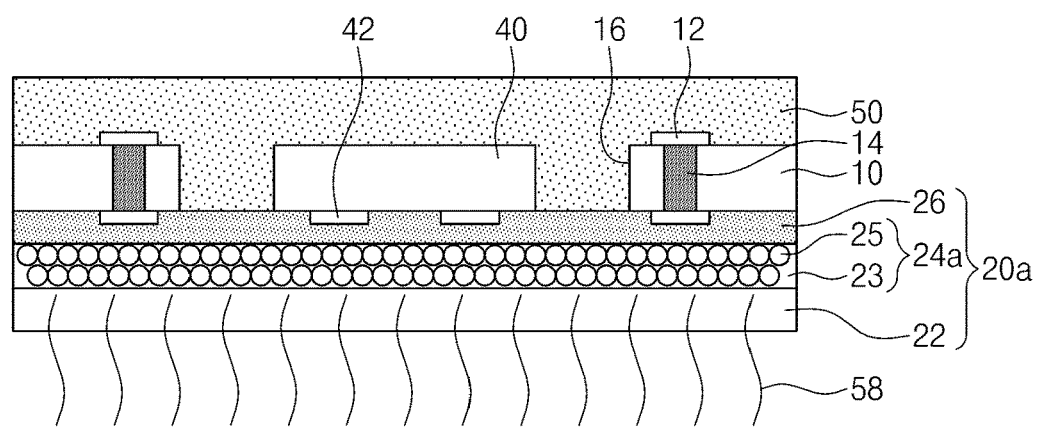

FIGS. 24 and 25 are sectional views exemplarily illustrating the step S50 of reducing an adhesive strength, shown in FIG. 1.

Referring to FIGS. 1, 24, and 25, the step S50 of reducing the adhesive strength may include heating the adhesive layer 24a. This may be in addition to, or as an alternative, to the method using light described previously. For example, the adhesive layer 24a may be heated to a temperature higher than the room temperature. For example, the adhesive layer 24a may be heated to a temperature of about 60° C.-150° C.

Referring to FIG. 24, the adhesive layer 24a of the carrier tape film 20a may include an adhesive 23 and beads 25. The adhesive 23 may be used to bond the tape substrate 22 with the insulating layer 26. For example, the adhesive 23 may be formed of or include a thermosetting resin adhesive containing at least one of epoxy resin, silicone resin, polyurethane resin, polyester resin, urea resin, furan resin, resorcinol resin, or phenol resin. In exemplary embodiments, the adhesive 23 may be formed of or include a thermoplastic resin adhesive containing polyacetic acidvinyl, polyvinylalcohol, polyvinyl chloride, polyvinyl butyral, polyacrylic acid ester, or nitrocellulose. The beads 25 may be formed in the adhesive 23.

Referring to FIG. 25, the adhesive layer 24a may be heated. In some embodiments, the beads 25 may be expanded by heat 58. The adhesive layer 24a may have an increased thickness. A distance between the insulating layer 26 and the tape substrate 22 may also be increased. The adhesive 23 may be separated from the insulating layer 26 due to the expansion of the beads 25. In some embodiments, the beads 25 may include polystyrene beads.

Thereafter, the adhesive layer 24a and the tape substrate 22 may be detached from the insulating layer 26. Although not shown, a cleaning process may be performed on the adhesive 23 remaining on the insulating layer 26.

As described above, in a package fabrication method according to some embodiments of the inventive concept, a package substrate, a die, and an encapsulation layer may be formed on an insulating layer of a carrier tape film, and then, an adhesive layer and a tape substrate of the carrier tape film may be removed from the insulating layer. The insulating layer may protect the encapsulation layer, when the adhesive layer is removed. Accordingly, it is possible to prevent the encapsulation layer from being damaged.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor package, comprising:
    forming a cavity in a package substrate;
    providing the package substrate and a die on a carrier tape film, the carrier tape film including a tape substrate, an adhesive layer on the tape substrate, and an insulating layer on the adhesive layer, and the die being provided in the cavity of the package substrate, wherein the adhesive layer and the insulating layer have a first light initiator and a second light initiator respectively, and wherein the package substrate includes substrate pads on a top and bottom surface of the package substrate;
    forming an encapsulation layer to cover the insulating layer and the die in the cavity and cover the package substrate on the insulating layer;
    irradiating a first light that selectively reacts with the first light initiator onto the adhesive layer to reduce an adhesive strength of the adhesive layer;
    removing the tape substrate from the insulating layer; and
    irradiating a second light that reacts with the second light initiator onto a portion of the insulating layer to form first contact holes on a portion of the package substrate and on a portion of the die.

2. The method of claim 1, wherein the adhesive layer is formed between the insulating layer and the tape substrate.

3. The method of claim 2, further comprising, prior to removing the tape substrate from the insulating layer, reducing the adhesive strength of the adhesive layer.

4. The method of claim 3,
    wherein the forming of the first contact holes comprises:
    irradiating the second light, whose wavelength is different from that of the first light, onto a portion of the insulating layer to form a first portion in the insulating layer; and
    removing the first portion to expose a portion of the die and a portion of the package substrate.

5. The method of claim 4, wherein the first light comprises a first ultraviolet light having a first wavelength, and
    the second light comprises a second ultraviolet light having a second wavelength different from the first wavelength.

6. The method of claim 4, further comprising:
    forming interconnection lines on portions of the die, the package substrate, and the insulating layer;
    forming a protection layer to have second contact holes exposing the interconnection lines; and
    forming bumps on the interconnection lines exposed through the second contact holes.

7. The method of claim 3, wherein the adhesive layer comprises:
    monomers with an adhesive functional group,
    wherein the first light initiator is mixed with the monomers, and
    wherein the adhesive functional group is removed by the first light initiator to which the first light is irradiated.

8. The method of claim 7, wherein the second light initiator is different from the first light initiator.

9. The method of claim 3, wherein the reducing of the adhesive strength of the adhesive layer comprises heating the adhesive layer.

10. The method of claim 9, wherein the adhesive layer comprises:
    an adhesive; and
    beads provided in the adhesive, wherein, during the heating of the adhesive layer, the beads are expanded to separate the adhesive from the insulating layer.

11. The method of claim 9, wherein the adhesive layer comprises a thermosetting resin or a thermoplastic resin.

12. The method of claim 2, wherein the adhesive layer comprises acrylic adhesives or acrylate adhesives.

13. The method of claim 1, wherein the providing of the package substrate and the die comprises:
pressing the package substrate on the carrier tape film; and
pressing the die on the carrier tape film.

14. The method of claim 1, wherein the providing of the package substrate and the die comprises:
pressing the die on the carrier tape film;
aligning the die with the cavity; and
pressing the package substrate on the carrier tape film.

15. A method of fabricating a semiconductor package, comprising:
forming a cavity in a package substrate;
pressing a carrier tape film on the package substrate, the carrier tape film comprising a tape substrate, an adhesive layer on the tape substrate, and an insulating layer on the adhesive layer, wherein the adhesive layer and the insulating layer have a first light initiator and a second light initiator respectively, and wherein the package substrate includes substrate pads on a top and bottom surface of the package substrate;
aligning a semiconductor device in the cavity and pressing the semiconductor device on the insulating layer;
forming an encapsulation layer on the insulating layer, the semiconductor device, and the package substrate;
irradiating a first light that selectively reacts with the first light initiator onto the adhesive layer to reduce an adhesive strength of the adhesive layer;
removing the adhesive layer and the tape substrate from the insulating layer; and
irradiating a second light that reacts with the second light initiator onto a portion of the insulating layer to form contact holes on a portion of the package substrate and on a portion of the semiconductor device.

16. A method of forming a semiconductor package, comprising:
providing a package substrate including an opening therein, wherein the package substrate includes substrate pads on a top and bottom surface of the package substrate;
providing a carrier tape film including a tape substrate and an insulating layer stacked on each other and attached to each other by an adhesive layer formed therebetween, wherein the adhesive layer and the insulating layer have a first light initiator and a second light initiator respectively;
placing the package substrate on a first surface of the insulating layer;
placing a semiconductor chip on the first surface of the insulating layer in the opening;
forming an encapsulation layer to cover the insulating layer and the semiconductor chip in the opening and to cover the package substrate on the insulating layer;
irradiating a first light that selectively reacts with the first light initiator onto the adhesive layer to reduce an adhesive strength of the adhesive layer;
removing the tape substrate from the insulating layer; and
irradiating a second light that reacts with the second light initiator onto a portion of the insulating layer to form contact holes on a portion of the package substrate and on a portion of the semiconductor chip.

17. The method of claim 16, wherein the tape substrate is formed of a transparent material.

18. The method of claim 16, wherein removing the tape substrate also removes the adhesive layer, and further comprising:
after removing the tape substrate and the adhesive layer, forming openings in the insulating layer.

19. The method of claim 18, wherein the openings are formed using light irradiation.

* * * * *